United States Patent
Tan et al.

(10) Patent No.: US 9,793,888 B2
(45) Date of Patent: Oct. 17, 2017

(54) TECHNIQUES FOR ENABLING AND DISABLING TRANSISTOR LEGS IN AN OUTPUT DRIVER CIRCUIT

(71) Applicant: Altera Corporation, San Jose, CA (US)

(72) Inventors: Tat Hin Tan, Bayan Lepas (MY); Yue-Song He, San Jose, CA (US); Choong Kit Wong, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/069,334

(22) Filed: Mar. 14, 2016

(65) Prior Publication Data

US 2017/0264283 A1    Sep. 14, 2017

(51) Int. Cl.
    H03K 3/00      (2006.01)
    H03K 17/16     (2006.01)
    H03K 17/687    (2006.01)

(52) U.S. Cl.
    CPC ...... *H03K 17/162* (2013.01); *H03K 17/6872* (2013.01)

(58) Field of Classification Search
    USPC ........................................................ 327/108
    See application file for complete search history.

(56) References Cited

U.S. PATENT DOCUMENTS

| | | | |
|---|---|---|---|
| 6,072,298 A * | 6/2000 | Martins | H02P 6/28 318/806 |
| 6,744,287 B2 | 6/2004 | Mooney et al. | |
| 6,850,443 B2 | 2/2005 | Lofgren et al. | |
| 8,531,205 B1 * | 9/2013 | Wang | H03K 19/0005 326/26 |
| 8,674,747 B2 * | 3/2014 | Iwasaki | H03K 19/018571 327/108 |
| 9,379,619 B2 * | 6/2016 | Barnette | H02M 3/33507 |
| 2005/0218927 A1 | 10/2005 | Shaikh et al. | |
| 2006/0066346 A1 | 3/2006 | Tat Lim et al. | |
| 2011/0267100 A1 | 11/2011 | Koo | |

FOREIGN PATENT DOCUMENTS

| | | |
|---|---|---|
| EP | 0999643 A1 | 5/2000 |
| KR | 10-0506887 B1 | 8/2005 |

OTHER PUBLICATIONS

Korean Intellectual Property Office, International Search Report and Written Opinion of the International Search Authority for international application PCT/US2017/017974, dated May 11, 2017, pp. 1-9.

* cited by examiner

*Primary Examiner* — Lincoln Donovan
*Assistant Examiner* — Patrick Chen
(74) *Attorney, Agent, or Firm* — Steven J. Cahill

(57) ABSTRACT

An output driver circuit includes a control circuit and first and second transistor legs that are coupled to an output pad. Each of the first and second transistor legs includes a pull-up transistor and a pull-down transistor. The control circuit is coupled to the first and second transistor legs. The control circuit enables the first transistor leg to generate an output signal at the output pad and disables the second transistor leg during a first phase of a cycle. The control circuit enables the second transistor leg to generate the output signal at the output pad and disables the first transistor leg during a second phase of the cycle. The control circuit repeats the first and the second phases of the cycle.

17 Claims, 7 Drawing Sheets

TECHNIQUES FOR ENABLING AND DISABLING TRANSISTOR LEGS IN AN OUTPUT DRIVER CIRCUIT

FIELD OF THE DISCLOSURE

The present disclosure relates to electronic circuits, and more particularly, to techniques for enabling and disabling transistor legs in an output driver circuit.

BACKGROUND

A data transmission system typically includes a number of integrated circuits (ICs). Data is communicated between the ICs in a data transmission system through transmission links that are external to the ICs. One or more data signals may be transmitted from a transmitter in one integrated circuit in a data transmission system to a receiver in another integrated circuit in the system through the transmission links. Each of two integrated circuits in a data transmission system may include a transmitter and a receiver to support two-way communication between the ICs.

BRIEF SUMMARY

According to some embodiments disclosed herein, an output driver circuit includes a control circuit and at least first and second transistor legs that are coupled to an output pad. Each of the first and second transistor legs includes a pull-up transistor and a pull-down transistor. The control circuit is coupled to the first and second transistor legs. The control circuit enables the first transistor leg to generate an output signal at the output pad and disables the second transistor leg during a first phase of a cycle. The control circuit enables the second transistor leg to generate the output signal at the output pad and disables the first transistor leg during a second phase of the cycle. The control circuit repeats the first and second phases of the cycle. According to additional embodiments, the output driver circuit has additional transistor legs that are enabled in additional repeating phases of the cycle.

Embodiments of the present invention can be implemented in numerous ways, such as a method, an apparatus, a system, or a device. Several embodiments of the present invention are disclosed herein. Various objects, features, and advantages of the present invention will become apparent upon consideration of the following detailed description and the accompanying drawings.

DETAILED DESCRIPTION

A transmitter in an integrated circuit (IC) in a data transmission system typically includes one or more output driver circuits. An output driver circuit may include several sets of transistors that operate in parallel to drive a data signal through an output pad of the IC and an external transmission link to a receiver circuit in another integrated circuit. The transistors in an output driver circuit are coupled to receive a supply voltage and a ground voltage through conductors in the integrated circuit. Conductors in an integrated circuit may also be referred to as wires. If several transistors in an output driver circuit share the same conductors that conduct current between the transistors and the supply or ground voltages, these conductors may suffer from electromigration caused by prolonged or excessive current flow.

Techniques for reducing electromigration include using more conductors for the signal paths or widening the widths of the conductors. However, these techniques may cause excessive capacitance at the output pad of the output driver that degrades the performance of the output driver. In some integrated circuit designs, electromigration cannot be reduced by using more conductors or by widening the conductors. For example, a design for a set of transistors in an output driver may be limited by a bottleneck of conductors that couple to the supply voltage and/or to the ground voltage. The conductors experiencing electromigration may be very near to the transistor terminals, and process limitations may not allow more conductors or vias to be attached to these terminals.

Typically, there are process variations within a lot of the integrated circuits (ICs) that are manufactured to have a particular IC design. A process corner refers to variations of fabrication process parameters used in forming an integrated circuit design in a semiconductor wafer. Process corners may refer to deviations of these parameters within a lot of ICs. Fast and slow process corners exhibit carrier mobility that is greater than and less than average, respectively. ICs at fast process corners may run faster than an average IC in the lot. ICs at slow process corners may run slower than an average IC in the lot. ICs that have faster circuits as a result of process variations may be referred to as fast process corner ICs. ICs that have slower circuits as a result of process variations may be referred to as slow process corner ICs. ICs that have average circuits within a lot may be referred to as typical process ICs.

According to some embodiments disclosed herein, techniques are provided that increase the reliability of output driver circuits by reducing the amount of current in conductors in the output driver circuits. Typically, an output driver circuit is designed to meet output impedance targets for all process corners in a lot of integrated circuits (ICs). An output driver circuit can be designed and built with enough transistors so that the output driver circuit meets an output impedance target for slow and fast process corner ICs in a lot. In fast process corner ICs, high current congestion may occur in conductors coupled to transistors in an output driver circuit. Each of the output driver circuits in fast process corner ICs has a surplus of transistors that are added for the slow process corner ICs. According to some embodiments, only a subset of the transistor legs in an output driver circuit are enabled at any given time in a fast process corner IC. The output driver circuit may enable different subsets of the transistor legs in the output driver circuit at different times so that less than all of the transistor legs are enabled at any one time. The output driver circuit may periodically swap the transistor legs that are enabled over time in a repeating cycle to reduce the overall current in the conductors, which lessens the effects of electromigration. By causing different subsets of the transistor legs to be enabled at different times in a repeating cycle, the output driver circuit reduces wear on the conductors coupled to the transistors. These embodiments may extend the lifetime of the conductors in the output driver circuit.

Figure 1A:
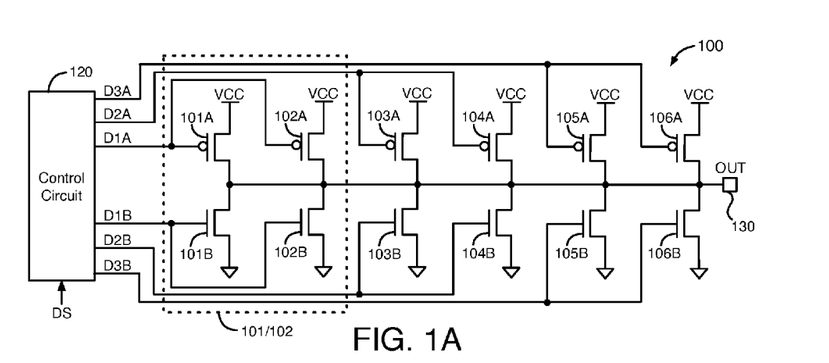
FIGS. 1A-1C illustrate an example of an output driver circuit, according to an embodiment.
Figure 1B:
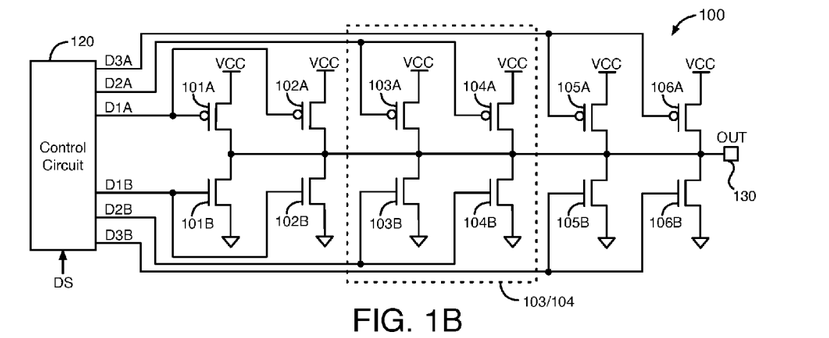
Figure 1C:
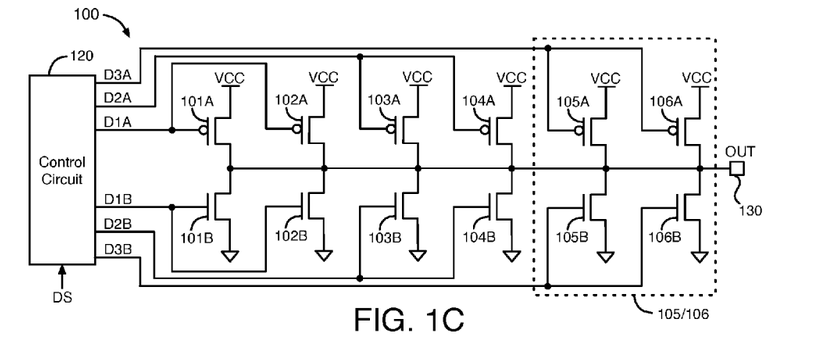

FIGS. 1A-1C illustrate an example of an output driver circuit 100, according to an embodiment. Output driver circuit 100 includes p-channel field-effect transistors (FETs) 101A, 102A, 103A, 104A, 105A, and 106A (i.e., transistors 101A-106A). Transistors 101A-106A are also referred to herein as pull-up transistors. Output driver circuit 100 also includes n-channel FETs 101B, 102B, 103B, 104B, 105B, and 106B (i.e., transistors 101B-106B). Transistors 101B-106B are also referred to herein as pull-down transistors. Transistors 101A-106A and 101B-106B may be, for example, metal oxide semiconductor FETs (MOSFETs). Output driver circuit 100 also includes a control circuit 120 and an output pad 130. Output driver circuit 100 is in an integrated circuit (IC). The IC may be any type of IC, such as a processor, a programmable logic IC, a memory IC, or an analog IC, just to name a few.

Output driver circuit 100 in FIGS. 1A-1C and FIG. 2 includes 6 transistor legs 101-106. The 6 transistor legs 101, 102, 103, 104, 105, and 106 in output driver circuit 100 are simplified representations of transistors 101A-101B, 102A-102B, 103A-103B, 104A-104B, 105A-105B, and 106A-106B, respectively. Each of the 6 transistor legs 101-106 includes a p-channel FET and an n-channel FET that are coupled together at their drain terminals. FIGS. 1A-1C show one pull-up transistor and one pull-down transistor in each of transistor legs 101-106 as an example. According to various embodiments, each of the 6 transistor legs 101-106 may include one, two, three, or more pull-up transistors, and each of the 6 transistor legs 101-106 may include one, two, three, or more pull-down transistors.

The drain of each of transistors 101A, 101B, 102A, 102B, 103A, 103B, 104A, 104B, 105A, 105B, 106A, and 106B is coupled to output pad 130. The source of each of transistors 101A, 102A, 103A, 104A, 105A, and 106A is coupled to a supply terminal through a shared conductor. The supply terminal is at a supply voltage VCC during circuit operation. The source of each of transistors 101B, 102B, 103B, 104B, 105B, and 106B is coupled to a ground terminal through a shared conductor. The ground terminal is at a ground voltage during circuit operation. The gates of transistors 101A, 101B, 102A, 102B, 103A, 103B, 104A, 104B, 105A, 105B, 106A, and 106B are coupled to outputs of control circuit 120 as shown in FIGS. 1A-1C.

Control circuit 120 receives an input signal DS at an input. Input signal DS may, for example, be a data signal that indicates data bits. Driver circuit 100 drives the data bits indicated by input signal DS to output pad 130 as output signal OUT during the normal operation of driver circuit 100. Output signal OUT may, for example, be a data signal that indicates data bits. Output driver circuit 100 causes output signal OUT to indicate the sequence of bits received in signal DS when output driver circuit 100 is in normal operation.

Control circuit 120 generates signals D1A, D1B, D2A, D2B, D3A, and D3B (i.e., D1A-D3B) at 6 separate outputs. Control circuit 120 generates signals D1A, D1B, D2A, D2B, D3A, and D3B based on input signal DS. Signal D1A is provided to the gates of transistors 101A and 102A. Signal D1B is provided to the gates of transistors 101B and 102B. Signal D2A is provided to the gates of transistors 103A and 104A. Signal D2B is provided to the gates of transistors 103B and 104B. Signal D3A is provided to the gates of transistors 105A and 106A. Signal D3B is provided to the gates of transistors 105B and 106B.

Transistors 101A, 101B, 102A, 102B, 103A, 103B, 104A, 104B, 105A, 105B, 106A, and 106B (i.e., transistors 101A-106B) generate output signal OUT at output pad 130 in response to signals D1A-D3B. Control circuit 120 controls the conductive states of transistors 101A-106B. Control circuit 120 turns the transistors in one or more of transistor legs 101-106 on and off to drive the bits indicated by signal DS to pad 130 as output signal OUT.

Figure 3A:
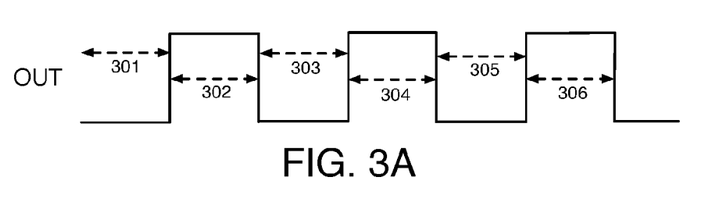
FIGS. 3A-3E are timing diagrams that illustrate various embodiments for enabling and disabling transistors in an output driver circuit to reduce noise in an output signal.

Control circuit 120 enables and disables transistor legs 101-106. Control circuit 120 may, for example, enable a transistor leg in output driver 100 (i.e., any one of transistor legs 101-106) by enabling only the pull-up transistor in that transistor leg during a first time period and by enabling only the pull-down transistor in that transistor leg during a second time period. The first and second time periods may be non-overlapping or may partially overlap. If the first and second time periods are non-overlapping, the pull-up and pull-down transistors in the transistor leg are not enabled concurrently. In the embodiment of FIG. 3A discussed below, output driver 100 may enable the pull-up transistor and the pull-down transistor in each transistor leg at different times.

Alternatively, control circuit 120 may enable a transistor leg in output driver 100 (i.e., any one of transistor legs 101-106) by enabling both the pull-up and the pull-down transistors in that transistor leg concurrently to generate the output signal OUT in response to signal DS. In the embodiment of FIGS. 1A-1C, output driver 100 causes the pull-up transistor and the pull-down transistor in each enabled transistor leg to be enabled concurrently. In this embodiment, the pull-up and pull-down transistors in each enabled transistor leg turn on and off to drive logic high and low bits to output signal OUT.

When control circuit 120 enables one or more of transistor legs 101-106, the enabled transistor legs supply output current to or from output pad 130 to drive bits to output signal OUT based on the bits indicated by signal DS. Control circuit 120 can enable any of transistor legs 101-106 by providing bits indicated by input signal DS to the gates of one or both of the transistors in each enabled transistor leg via the corresponding signals D1A-D3B. Control circuit 120 disables a transistor leg in output driver 100 (i.e., any one of transistor legs 101-106) by disabling both the pull-up and the pull-down transistors in that transistor leg from generating the output signal OUT in response to signal DS. When control circuit 120 disables one or more of transistor legs 101-106, both of the transistors in each of the disabled transistor legs remain off.

Control circuit 120 enables the transistors in more of the transistor legs to turn on and off in an output driver circuit 100 having process variations that cause the transistors to operate slower to increase the output current. For example, if output driver circuit 100 is in a slow process corner IC, control circuit 120 may enable all 6 transistor legs 101-106. In this example, control circuit 120 turns on all 6 of p-channel transistors 101A-106A to pull the voltage at pad 130 to VCC, while maintaining n-channel transistors 101B-106B off. In this example, control circuit 120 turns on all 6 of n-channel transistors 101B-106B to pull the voltage at pad 130 to ground, while maintaining p-channel transistors 101A-106A off. The p-channel and n-channel FETs in a transistor leg that is enabled by control circuit 120 turn on in response to logic low and high states, respectively, at their gates.

Control circuit 120 enables the transistors in less of the transistor legs to turn on and off in an output driver circuit 100 having process variations that cause the transistors to operate faster to reduce the output current. In output driver circuits 100 having faster transistors as a result of process variations, control circuit 120 enables different subsets of the 6 transistor legs 101-106 at different times to drive output signal OUT to pad 130. Enabling different subsets of transistor legs 101-106 at different times reduces the output current and reduces wear on the conductors in each transistor leg. An example of control circuit 120 enabling different subsets of transistor legs 101-106 at different times to generate output signal OUT is shown in FIGS. 1A-1C.

According to an embodiment, control circuit 120 enables the transistor legs 101-106 to generate output signal OUT in three different phases of a repeating cycle. The first, second, and third phases of the cycle occur during first, second, and third periods of time, respectively. The first, second, and third periods of time are consecutive and may partially overlap or be non-overlapping. This embodiment may be used, for example, in an output driver circuit having faster transistors in a fast process corner IC. This embodiment is now described in detail.

During the first phase, control circuit 120 generates signals D1A and D1B based on signal DS, thereby enabling transistor legs 101 and 102 to generate output signal OUT in response to signal DS by way of signals D1A and D1B, as shown in FIG. 1A. When transistor legs 101/102 are enabled, transistors 101A and 102A turn on in response to signal D1A being a logic low to pull signal OUT to VCC, and transistors 101B and 102B turn on in response to signal D1B being a logic high to pull signal OUT to ground. During the first phase, control circuit 120 disables transistor legs 103-106 by causing signals D2A, D2B, D3A, and D3B to be at voltages that maintain all of the transistors in transistor legs 103-106 off.

During the second phase, control circuit 120 generates signals D2A and D2B based on signal DS, thereby enabling transistor legs 103 and 104 to generate output signal OUT in response to signal DS by way of signals D2A/D2B, as shown in FIG. 1B. When transistor legs 103/104 are enabled, transistors 103A and 104A turn on in response to signal D2A being a logic low to pull signal OUT to VCC, and transistors 103B and 104B turn on in response to signal D2B being a logic high to pull signal OUT to ground. During the second phase, control circuit 120 disables transistor legs 101, 102, 105, and 106 by causing signals D1A, D1B, D3A, and D3B to be at voltages that maintain all of the transistors in transistor legs 101, 102, 105, and 106 off.

During the third phase, control circuit 120 generates signals D3A and D3B based on signal DS, thereby enabling transistor legs 105 and 106 to generate output signal OUT in response to signal DS by way of signals D3A/D3B, as shown in FIG. 1C. When transistor legs 105/106 are enabled, transistors 105A and 106A turn on in response to signal D3A being a logic low to pull signal OUT to VCC, and transistors 105B and 106B turn on in response to signal D3B being a logic high to pull signal OUT to ground. During the third phase, control circuit 120 disables transistor legs 101-104 by causing signals D1A, D1B, D2A, and D2B to be at voltages that maintain all of the transistors in transistor legs 101-104 off.

Thus, control circuit 120 only enables transistor legs 101 and 102 to generate output signal OUT during the first phase. Control circuit 120 only enables transistor legs 103 and 104 to generate output signal OUT during the second phase. Control circuit 120 only enables transistor legs 105 and 106 to generate output signal OUT during the third phase. Control circuit 120 periodically repeats the functions described above for the first, second, and third phases. Typically, only two transistor legs are enabled at any one time in this embodiment for an output driver in a fast process corner IC. As a result, the average current in the shared conductor coupled to the sources of transistors 101A-106A and to the supply terminal at VCC is reduced. Also, the average current in the shared conductor coupled to the sources of transistors 101B-106B and to the ground terminal at the ground voltage is reduced. Reducing the average current in these conductors reduces the adverse effects of electromigration, which extends the lifetime of these conductors. By causing different subsets of the transistor legs 101-106 to be enabled at different times in a repeating cycle, output driver circuit 100 reduces wear on the conductors within each of the transistor legs 101-106.

According to another embodiment, control circuit 120 enables 4 of the 6 transistor legs 101-106 to generate output signal OUT in each of three different phases of a repeating cycle. During the first phase, control circuit 120 enables transistor legs 101-104. During the second phase, control circuit 120 enables transistor legs 103-106. During the third phase, control circuit 120 enables transistor legs 101-102 and 105-106. The first, second, and third phases in this embodiment are repeating and consecutive. This embodiment may be used, for example, in an output driver circuit having average speed transistors in a typical process IC.

Figure 2:
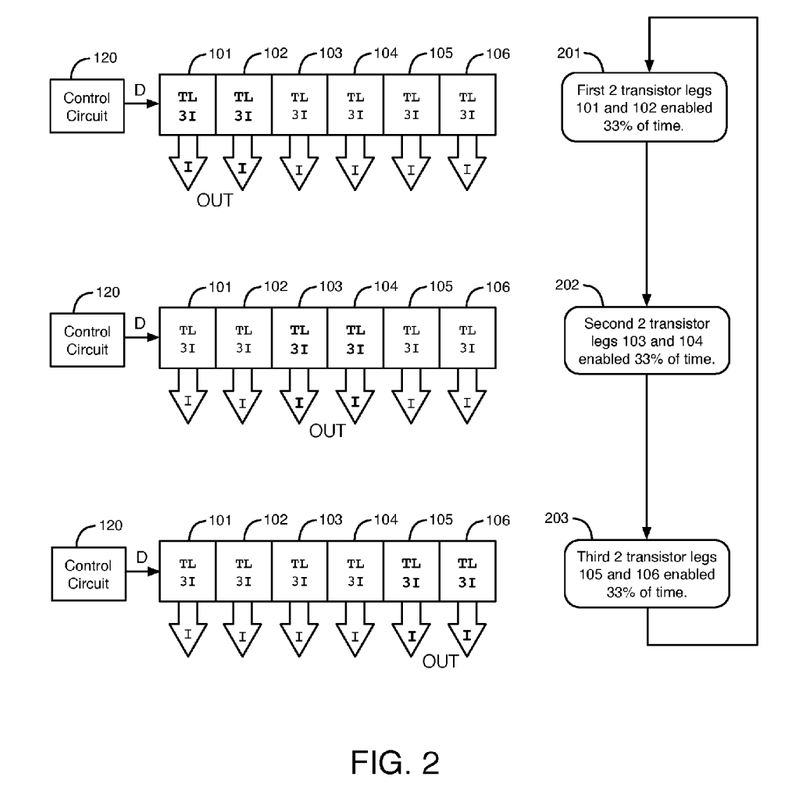
FIG. 2 is a graphical representation illustrating further details of an output driver circuit that enables different subsets of transistor legs to drive an output signal to an output pad, according to an embodiment.

FIG. 2 is a graphical representation illustrating further details of an output driver circuit 100 that enables different subsets of transistor legs to drive an output signal to an output pad, according to an embodiment. The transistor legs (TL) 101-106 shown in FIG. 2 are the same transistor legs 101-106 shown in FIGS. 1A-1C. FIG. 2 shows an example of control circuit 120 enabling two of transistor legs 101-106 in each of three different phases to generate output signal OUT. FIG. 2 shows further details of the techniques described above for an output driver circuit 100 having faster transistors that is in a fast process corner IC.

Control circuit 120 provides data signals D to transistor legs 101-106. Data signals D represent signals D1A, D1B, D2A, D2B, D3A, and D3B shown in FIGS. 1A-1C. FIG. 2 shows a flow chart having three phases 201-203 that occur during three consecutive, repeating periods of time. The three periods of time combined equal one cycle of phases 201-203. Driver circuit 100 performs the functions described below for phases 201-203 in the order shown in FIG. 2, performing phase 201 first, phase 202 second, and phase 203 third. Driver circuit 100 may repeat phases 201-203 any number of times, e.g., 2, 3, 4, hundreds, thousands, or millions of times, as a few examples.

During a first period of time in phase 201, the first two transistor legs 101-102 are enabled during 33% of one cycle to generate output signal OUT in response to a first subset of signals D. During a second period of time in phase 202, the second two transistor legs 103-104 are enabled during another 33% of one cycle to generate output signal OUT in response to a second subset of signals D. During a third period of time in phase 203, the third two transistor legs 105-106 are enabled during another 33% of one cycle to generate output signal OUT in response to a third subset of signals D.

After phase 203, driver circuit 100 performs another cycle of phases 201-203. Driver circuit 100 may continue to perform cycles of phases 201-203 iteratively until driver circuit 100 is disabled. The functions of phases 201-203 are controlled by control circuit 120. Control circuit 120 may include a counter circuit or another type of timer to control the duration of the first, second, and third periods of time. Control circuit 120 may include, for example, a state machine implemented in programmable logic, a processor circuit or a portion of a processor circuit, a non-programmable controller circuit, or another type of control circuit.

In a fast process corner IC, each of the transistor legs 101-106 generates a current that equals 3I when that transistor leg is enabled and one of its two transistors is on. Because each of the transistor legs 101-106 is enabled only 33% of one cycle as described above, the average output current of each of transistor legs 101-106 equals I over the total time of one cycle of phases 201-203. The average output current I of each of transistor legs 101-106 over one cycle of phases 201-203 equals one-third of its average output current 3I when that transistor leg is enabled to conduct current. As a result, the average current through the shared conductor coupled to the transistor legs 101-106 and the supply terminal at VCC equals 2I, and the average current through the shared conductor coupled to the transistor legs 101-106 and the ground terminal at the ground voltage also equals 2I. 2I equals one-third of the current 6I that would flow through these conductors if all 6 transistor legs 101-106 were enabled at the same time.

An output driver circuit having features disclosed herein can enable different subsets of transistor legs without compromising the quality of the output signal generated by the output driver circuit, i.e., without increasing noise in the output signal. According to some embodiments, an output driver circuit can determine a sequence of bits to be generated in its output signal before the output driver circuit receives the sequence of bits in an input signal. For example, the output driver circuit may determine a sequence of bits in advance from a first-in-first-out (FIFO) queue that stores bits for the input signal provided to the output driver circuit. Information regarding bits stored in the FIFO queue may be provided to the output driver circuit before the bits are generated in the input signal. Based on information that the output driver circuit receives about bits not yet received in the input signal, the output driver circuit can opportunistically enable the next set of pull-up transistors when the output driver circuit is driving the output signal low. In addition, the output driver circuit can enable the next set of pull-down transistors when the output driver circuit is driving the output signal high.

FIGS. 3A-3E are timing diagrams that illustrate various embodiments for enabling transistors in an output driver circuit to reduce noise in an output signal. The techniques disclosed herein with respect to FIGS. 3A-3E allow an output driver circuit to reduce signal noise in output signal OUT by timing the disabling of the current set of transistors generating the output signal OUT and the enabling of the next set of transistors to generate output signal OUT based on information that the output driver circuit receives about bits that have not yet been received in the input signal DS. The output driver circuit may receive the advance information about the input signal, as described above.

FIG. 3A is a timing diagram that illustrates an example of how an output driver circuit can enable and disable different sets of pull-up and pull-down transistors to reduce output noise, according to an embodiment. FIG. 3A illustrates an exemplary waveform for output signal OUT. As shown in FIG. 3A, output signal OUT toggles between logic high and logic low states. During time periods 301, 303, and 305, output signal OUT is low. During time periods 302, 304, and 306, output signal OUT is high. Output driver circuit 100 times the enabling and disabling of the transistors based on information that output driver circuit 100 receives about bits that have not yet been received in the input signal DS during time periods 301-306 to reduce noise, as described below.

During time period 301, output driver circuit 100 causes enabled transistors 105B and 106B to be on to pull output signal OUT low and disables transistors 105A and 106A. Also during time period 301, output driver circuit 100 enables transistors 101A and 102A, while maintaining transistors 101A and 102A off in response to the input signal DS, so that transistors 101A and 102A can being conducting current at the beginning of time period 302 to reduce noise. In this embodiment, transistors 105B, 106B, 101A, and 102A are enabled concurrently for a brief period of time, although transistors 101A and 102A are off while transistors 105B and 106B are on.

During time period 302, output driver circuit 100 causes the enabled transistors 101A and 102A to be on to pull output signal OUT high and disables transistors 105B-106B. Also during time period 302, output driver circuit 100 enables transistors 101B and 102B, while maintaining transistors 101B and 102B off, so that transistors 101B and 102B can begin conducting current at the beginning of time period 303 to reduce noise. In the example of FIG. 3A, the pull-up transistor within each transistor leg is enabled at a different time than the pull-down transistor within that transistor leg.

During time period 303, output driver circuit 100 causes the enabled transistors 101B and 102B to be on to pull output signal OUT low and disables transistors 101A and 102A. Also during time period 303, output driver circuit 100 enables transistors 103A and 104A, while maintaining transistors 103A and 104A off, so that transistors 103A and 104A can begin conducting current at the beginning of time period 304 to reduce noise.

During time period 304, output driver circuit 100 causes the enabled transistors 103A and 104A to be on to pull output signal OUT high and disables transistors 101B and 102B. Also, during time period 304, output driver circuit 100 enables transistors 103B and 104B, while maintaining transistors 103B and 104B off, so that transistors 103B and 104B can begin to conduct current at the beginning of time period 305 to reduce noise.

During time period 305, output driver circuit 100 causes the enabled transistors 103B and 104B to be on to pull output signal OUT low and disables transistors 103A and 104A. Also during time period 305, output driver circuit 100 enables transistors 105A and 106A, while maintaining transistors 105A and 106A off, so that transistors 105A and 106A can begin conducting current at the start of time period 306 to reduce noise.

During time period 306, output driver circuit 100 causes the enabled transistors 105A and 106A to be on to pull output signal OUT high and disables transistors 103B and 104B. Also during time period 306, output driver circuit 100 enables transistors 105B and 106B, while maintaining transistors 105B and 106B off, so that transistors 105B and 106B can begin to conduct current after time period 306. The output driver circuit 100 may continuously repeat this process. Alternatively, output driver circuit 100 may at any time use another technique for switching between enabled transistor legs, such as the additional techniques described below.

According to various embodiments of the techniques presented herein, an output driver circuit may cause any number of transistor legs to be enabled during repeating time periods. In the embodiment of FIG. 3A, 2 transistors were on at the same time in each time period 301-306. As another example, each transistor can be on at a different time. In this example, the noise generated in the output signal by enabling different transistors is reduced by half.

Figure 3B:
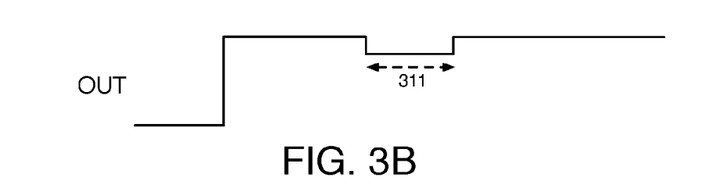
Figure 3C:
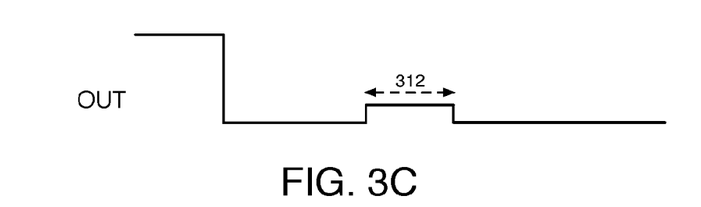

FIGS. 3B and 3C are timing diagrams that illustrate examples of waveforms of an output signal OUT of an output driver circuit 100 that turns on and off transistors in different transistor legs when the output signal OUT is not toggling high or low, according to further embodiments.

In FIG. 3B, output driver circuit 100 causes the output signal OUT to transition from a logic low state to a logic high state by turning on one of the pull-up transistors 101A, 102A, 103A, 104A, 105A, or 106A. Signal OUT remains in the logic high state for a period of time. Output driver circuit 100 then turns off the pull-up transistor that is on and turns on another one of the pull-up transistors during time period 311 to reduce wear on the conductors, while signal OUT is in the logic high state. As shown in FIG. 3B, signal OUT decreases temporarily during time period 311 as output driver circuit 100 turns off one pull-up transistor and turns on another pull-up transistor. The decrease in signal OUT during time period 311 is noise. This noise can be reduced by turning off only one pull-up transistor and turning on only one other pull-up transistor while signal OUT is high.

In FIG. 3C, output driver circuit 100 causes the output signal OUT to transition from a logic high state to a logic low state by turning on one of the pull-down transistors 101B, 102B, 103B, 104B, 105B, or 106B. Signal OUT remains in the logic low state for a period of time. Output driver circuit 100 then turns off the pull-down transistor that is on and turns on another one of the pull-down transistors during time period 312 to reduce wear on the conductors, while signal OUT is in the logic low state. As shown in FIG. 3C, signal OUT increases temporarily during time period 312 as output driver circuit 100 turns off one pull-down transistor and turns on another pull-down transistor. The increase in signal OUT during time period 312 is noise. This noise can be reduced by turning off only one pull-down transistor and turning on only one other pull-down transistor while signal OUT is low.

Figure 3D:
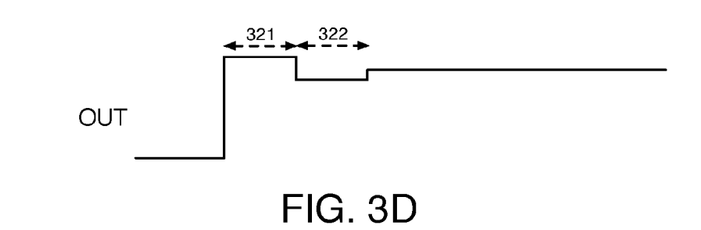
Figure 3E:
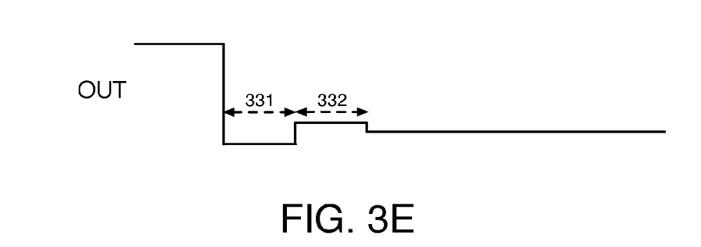

According to further embodiments, an output driver circuit can also pre-emphasize or de-emphasize the output signal prior to enabling the next set of transistor legs to reduce signal noise in the output signal. Examples of these embodiments are illustrated in FIGS. 3D-3E. FIG. 3D is a timing diagram that illustrates an exemplary waveform for an output signal OUT of an output driver circuit 100 that pre-emphasizes the output signal OUT prior to turning on and off transistors in different transistor legs when the output signal OUT is not toggling, according to a further embodiment.

In FIG. 3D, output driver circuit 100 causes the output signal OUT to transition from a logic low state to a logic high state at the start of time period 321 by turning on at least one of the pull-up transistors. Output driver circuit 100 also pre-emphasizes signal OUT during time period 321 by turning on an additional pull-up transistor coupled to pad 130. After time period 321, output driver circuit 100 turns off the pull-up transistors that were on in time period 321 and turns on at least one of the other pull-up transistors during time period 322 to reduce wear on the conductors, while signal OUT is in the logic high state. Signal OUT decreases temporarily during time period 322. The noise generated in signal OUT in time period 322 is reduced by the pre-emphasis added to signal OUT in time period 321.

FIG. 3E is a timing diagram that illustrates an exemplary waveform for an output signal OUT of an output driver circuit 100 that de-emphasizes the output signal OUT prior to turning on and off transistors in different transistor legs when the output signal OUT is not toggling, according to a further embodiment. In FIG. 3E, output driver circuit 100 causes the output signal OUT to transition from a logic high state to a logic low state at the start of time period 331 by turning on at least one of the pull-down transistors. Output driver circuit 100 also de-emphasizes signal OUT during time period 331 by turning on an additional pull-down transistor coupled to pad 130. After time period 331, output driver circuit 100 turns off the pull-down transistors that were on in time period 331 and turns on at least one of the other pull-down transistors during time period 332 to reduce wear on the conductors, while signal OUT is in the logic low state. Signal OUT increases temporarily during time period 332. The noise generated in signal OUT in time period 332 is reduced by the de-emphasis added to signal OUT in time period 331.

In the equations below, M is the number of transistor legs that need to be enabled in each phase in an output driver circuit in the fastest process corner IC in a lot to meet its output impedance target. I is the current driven by each transistor leg. J is the lifetime conductor electromigration (EM) current limit (e.g., for metal wires in an IC). S is the number of transistor legs that need to be enabled in each phase in an output driver circuit in the slowest process corner IC in the lot to meet its output impedance target. N is the total number of transistor legs in the output driver circuit. N is determined using equation (1) below. In equations (1) and (4) below, "ceiling" refers to the nearest integer number that is greater than or equal to the number within the parenthesis.

$$N = \max(\text{ceiling } (MI/J), S) \quad (1)$$

If N is less than or equal to the minimum number of transistor legs needed to meet the output impedance target for an output driver circuit in the slowest process corner IC in the lot, then the output driver circuit does not need any extra transistor legs. If N is larger than the minimum number of transistor legs needed to meet the output driver impedance target for an output driver circuit in the slowest process corner IC, then the output driver circuit has a higher capacitance at the output pad than necessary. Therefore, it is desirable to design and size each transistor leg to minimize N. The total number of phases (TNP) in one cycle that the transistor legs are enabled and disabled is determined by equation (2) below. In equation (2), GCD refers to the greatest common divisor of the two numbers in the parenthesis. The greatest common divisor (GCD) of two numbers is the largest positive integer that divides both of the two numbers without remainders.

$$TNP = N/GCD(M,N) \quad (2)$$

Equation (2) is derived based on the fact that the number of enabled transistor legs in a phase must be a divisor of both N and M. The total activity factor (TAF) of a transistor leg in the output driver circuit is a number that indicates a fraction (or percentage) of time that the transistor leg is conducting output current during a cycle. The TAF of a transistor leg is determined using equation (3) below. In equation (3), MIN refers to the lesser of the two numbers in the parenthesis.

$$TAF=MIN(J/I,M/N) \quad (3)$$

The TAF of equation (3) can be a fraction. The number of active phases (NAP) that each transistor leg conducts current can be determined by using equation (4) below. The number of active phases (NAP) indicates the number of phases that a transistor leg in the output driver circuit is conducting current during one cycle.

$$NAP=\text{ceiling}(TNP \times TAF) \quad (4)$$

The activity factor (AF) contributed by an active phase in a cycle is thus derived using equation (5) below.

$$AF=1/NAP \quad (5)$$

Table 1 below shows exemplary values for the parameters described above. It should be understood that the values shown in Table 1 are provided for illustration and are not intended to be limiting. Also, if the parameters S, M, I, N, TNP, TAF, and AF are applied to the pull-up transistors, another set of parameters S', M', I', N', TNP', TAF', and AF' may be applied to the pull-down transistors, because the pull-up transistors may not share the same characteristics as the pull-down transistors. Table 1 shows only one set of values for S, M, I, N, TNP, TAF, and AF. However, the values shown in Table 1 can also be applied to the other set of parameters S', M', I', N', TNP', TAF', and AF'.

TABLE 1

| S | Number of transistor legs for output driver impedance target in slowest process corner IC | 10 |
|---|---|---|
| M | Number of transistor legs for output driver impedance target in fastest process corner IC | 8 |
| I | Output current per transistor | 2.5 mA |
| J | Lifetime EM current limit | 2 mA |
| N | Total number of transistor legs | 10 |
| TNP | Total number of phases | 5 |
| TAF | Total activity factor per transistor leg | 80% |
| AF | Activity factor contributed by an active phase | 20% |

Table 2 below shows the current output by each transistor leg (TL) in an output driver circuit having 10 transistor legs during 5 phases (P1-P5) of a cycle using the exemplary values from Table 1. LAC refers to the lifetime average output current of the output driver circuit.

TABLE 2

| Transistor leg currents in milliamps (mA) | | | | | | | | | | |
|---|---|---|---|---|---|---|---|---|---|---|
| TL 1 | TL 2 | TL 3 | TL 4 | TL 5 | TL 6 | TL 7 | TL 8 | TL 9 | TL 10 | AF |
| P1 | 2.5 | 2.5 | 2.5 | 2.5 | 2.5 | 2.5 | 2.5 | 2.5 | 0 | 0 | 20% |
| P2 | 0 | 0 | 2.5 | 2.5 | 2.5 | 2.5 | 2.5 | 2.5 | 2.5 | 2.5 | 20% |
| P3 | 2.5 | 2.5 | 0 | 0 | 2.5 | 2.5 | 2.5 | 2.5 | 2.5 | 2.5 | 20% |

TABLE 2-continued

| Transistor leg currents in milliamps (mA) | | | | | | | | | | |
|---|---|---|---|---|---|---|---|---|---|---|
| TL 1 | TL 2 | TL 3 | TL 4 | TL 5 | TL 6 | TL 7 | TL 8 | TL 9 | TL 10 | AF |
| P4 | 2.5 | 2.5 | 2.5 | 2.5 | 0 | 0 | 2.5 | 2.5 | 2.5 | 2.5 | 20% |
| P5 | 2.5 | 2.5 | 2.5 | 2.5 | 2.5 | 2.5 | 0 | 0 | 2.5 | 2.5 | 20% |
| LAC | 2 | 2 | 2 | 2 | 2 | 2 | 2 | 2 | 2 | 2 | |

Tables 1 and 2 show some examples of how the techniques and equations disclosed herein may be implemented to reduce the average output current of an output driver circuit. If the output driver circuit is designed for a worst case fastest process corner IC that generates the highest current density per transistor leg, then the output driver circuit can be configured to function across all process corners. The number of phases in each cycle can be altered by control circuit 120 in slower process corner ICs to increase the output current of the output driver circuit. An example of increasing the number of phases in each cycle in a slower process corner IC is discussed below with respect to Tables 3-4.

If the process used for an IC design has shifted and become slightly slower, the output driver circuit in the fastest process corner IC may, for example, need 9 transistor legs (M=9) to meet its output impedance target, instead of 8 transistor legs. In this example, the output driver circuit in the slowest process corner IC still needs 10 transistor legs (S=10) to meet its output impedance target. Table 3 below shows additional values that further illustrate this example. As shown in Table 3, the total number of phases (TNP) increases from 5 phases to 10 phases in this example. As long as the changes in the process of the IC do not require more than N transistor legs for the slowest process corner IC, the design of the output driver circuit does not need to be changed, and the total number N of transistor legs in the output driver circuit can remain constant. The factor M×I in equation (1) is equivalent to the total output current of the output driver. In most cases, the total output current of the output driver circuit is a constant value that is based on industry interface specifications or signal integrity considerations.

TABLE 3

| S | Number of transistor legs for output driver impedance target in slowest process corner IC | 10 |
|---|---|---|
| M | Number of transistor legs for output driver impedance target in fastest process corner IC | 9 |
| I | Output current per transistor | 2.2222 mA |
| J | Lifetime EM current limit | 2 mA |
| N | Total number of transistor legs in output driver | 10 |
| TNP | Total number of phases | 10 |
| TAF | Total activity factor per transistor leg | 90% |
| NAP | Number of active phases | 9 |
| AF | Activity factor contributed by an active phase | 10% |

Table 4 below shows the current output by each transistor leg (TL) in an output driver circuit having 10 transistor legs during 10 phases (P1-P10) of a cycle using the exemplary values from Table 3.

TABLE 4

| Transistor leg currents in milliamps (mA) | | | | | | | | | | |
|---|---|---|---|---|---|---|---|---|---|---|
| | TL 1 | TL 2 | TL 3 | TL 4 | TL 5 | TL 6 | TL 7 | TL 8 | TL 9 | TL 10 | AF |
| P1 | 2.22 | 2.22 | 2.22 | 2.22 | 2.22 | 2.22 | 2.22 | 2.22 | 2.22 | 0 | 10% |
| P2 | 0 | 2.22 | 2.22 | 2.22 | 2.22 | 2.22 | 2.22 | 2.22 | 2.22 | 2.22 | 10% |
| P3 | 2.22 | 0 | 2.22 | 2.22 | 2.22 | 2.22 | 2.22 | 2.22 | 2.22 | 2.22 | 10% |

TABLE 4-continued

| | Transistor leg currents in milliamps (mA) | | | | | | | | | | |
|---|---|---|---|---|---|---|---|---|---|---|---|
| | TL 1 | TL 2 | TL 3 | TL 4 | TL 5 | TL 6 | TL 7 | TL 8 | TL 9 | TL 10 | AF |
| P4 | 2.22 | 2.22 | 0 | 2.22 | 2.22 | 2.22 | 2.22 | 2.22 | 2.22 | 2.22 | 10% |
| P5 | 2.22 | 2.22 | 2.22 | 0 | 2.22 | 2.22 | 2.22 | 2.22 | 2.22 | 2.22 | 10% |
| P6 | 2.22 | 2.22 | 2.22 | 2.22 | 0 | 2.22 | 2.22 | 2.22 | 2.22 | 2.22 | 10% |
| P7 | 2.22 | 2.22 | 2.22 | 2.22 | 2.22 | 0 | 2.22 | 2.22 | 2.22 | 2.22 | 10% |
| P8 | 2.22 | 2.22 | 2.22 | 2.22 | 2.22 | 2.22 | 0 | 2.22 | 2.22 | 2.22 | 10% |
| P9 | 2.22 | 2.22 | 2.22 | 2.22 | 2.22 | 2.22 | 2.22 | 0 | 2.22 | 2.22 | 10% |
| P10 | 2.22 | 2.22 | 2.22 | 2.22 | 2.22 | 2.22 | 2.22 | 2.22 | 0 | 2.22 | 10% |
| LAC | 2 | 2 | 2 | 2 | 2 | 2 | 2 | 2 | 2 | 2 | |

The number of transistor legs used to meet the impedance target in the output driver circuit can be changed across process corners by enabling a different number of the transistor legs in each phase of a cycle. This is advantageous, because only a single design or implementation of an IC may be taped out on a mask. There may be no way of knowing in advance which process corner an individual IC is in until the IC is tested.

In some embodiments, the output driver circuit drives the transistor legs in a binary fashion as discussed in detail below. In these embodiments, a binary search is performed during the driver output impedance calibration process to determine the number of transistor legs that need to be enabled to conduct output current to meet an output impedance target for the output driver circuit in a fastest, typical, or slowest process corner IC. Adjustments are then made to the number of transistor legs enabled to conduct output current during each phase of a cycle based on process variations, as disclosed herein.

Figure 4A:
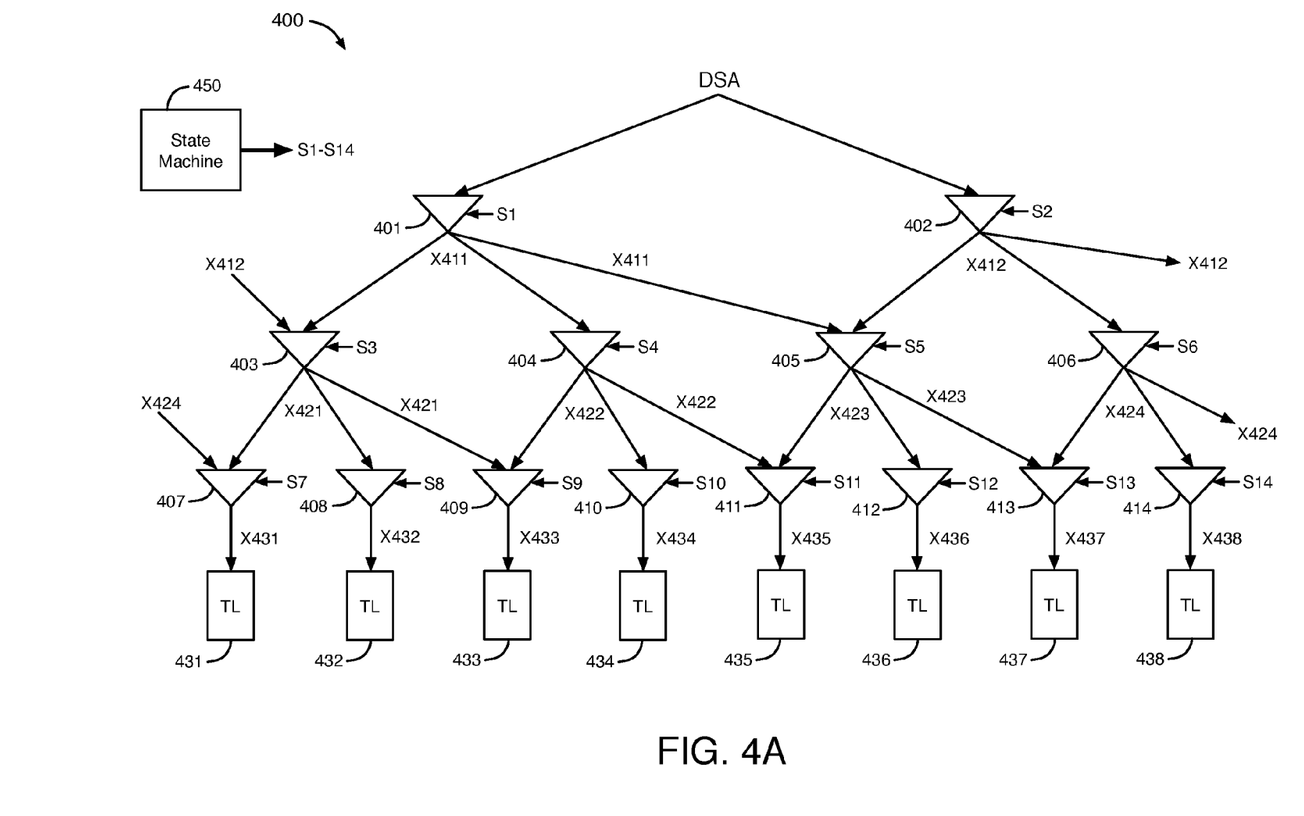
FIG. 4A illustrates an output driver circuit having pre-driver circuits that can enable four transistor legs to generate an output signal during each phase of a cycle, according to an embodiment.
Figure 4B:
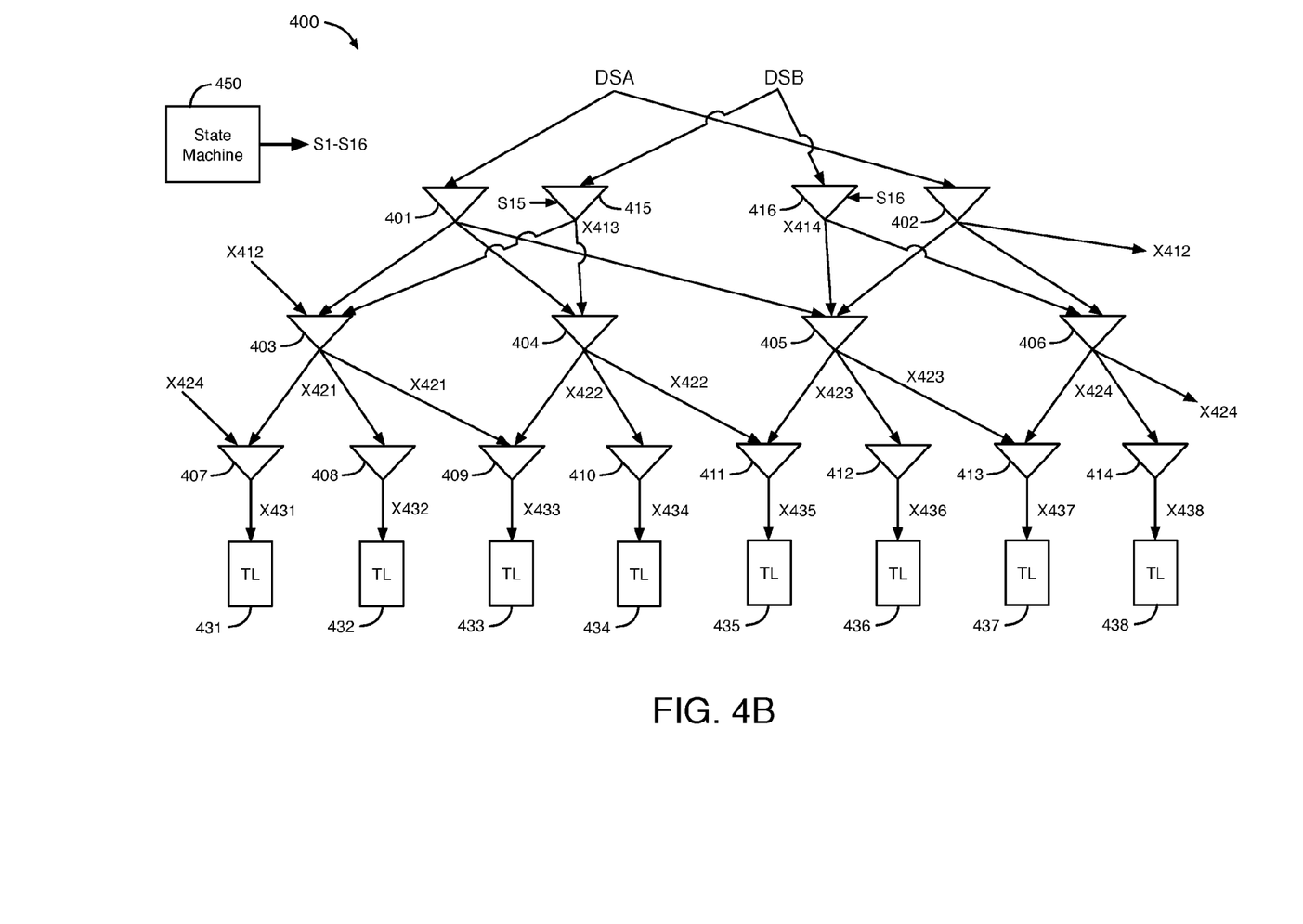
FIG. 4B illustrates an output driver circuit that is a superset of FIG. 4A having extra pre-driver circuits that can enable two transistor legs to generate an output signal during each phase of a cycle, according to an embodiment.
Figure 4C:
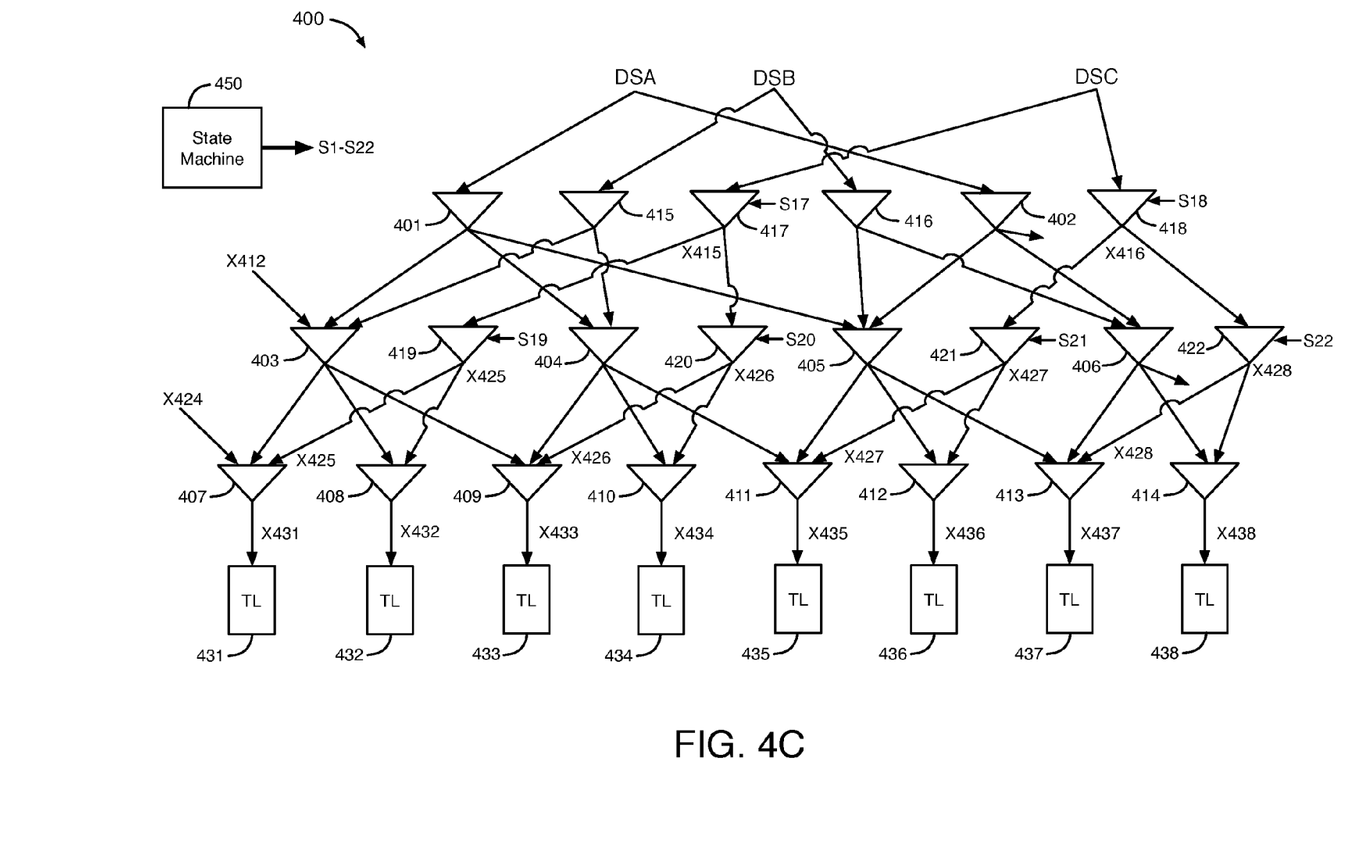
FIG. 4C illustrates an output driver circuit that is a superset of FIG. 4B having extra pre-driver circuits that can enable only one transistor leg to generate an output signal during each phase of a cycle, according to an embodiment.

In some embodiments, the transistor legs are driven by pre-driver circuits that control the transistor legs in binary fashion (i.e., 2, 4, 6, 8, 16, 32, etc.). FIGS. 4A-4C illustrate some examples of these embodiments. FIG. 4A illustrates an output driver circuit having only pre-driver circuits that can enable 4 transistor legs to generate an output signal during each phase of a cycle, according to an embodiment. FIG. 4B illustrates an output driver circuit that is a superset of FIG. 4A having additional pre-driver circuits that can enable 2 transistor legs to generate an output signal during each phase of a cycle, according to an embodiment. FIG. 4C illustrates an output driver circuit that is a superset of FIG. 4B having additional pre-driver circuits that can enable only 1 transistor leg to generate an output signal during each phase of a cycle, according to an embodiment. In the embodiments disclosed with respect to FIGS. 4A-4C, the number N of transistor legs in the output driver circuit equals 8. However, it should be understood that additional embodiments may include output driver circuits with any number of transistor legs.

FIG. 4A illustrates a portion of an output driver circuit 400 that includes 3 stages of pre-driver circuits and 8 transistor legs, according to an embodiment. As shown in FIG. 4A, output driver circuit 400 includes 14 pre-driver circuits 401-414, 8 transistor legs 431-438, and a state machine circuit 450. Pre-driver circuits 401-414 are controlled by state machine 450. Pre-driver circuits 401-414 and state machine 450 are part of a control circuit that controls the operations of output driver circuit 400. Each of the 8 transistor legs 431-438 includes at least one pull-up transistor coupled to at least one pull-down transistor between a high supply voltage VCC and a ground voltage, as disclosed herein with respect to each of the transistor legs in output driver circuit 100 of FIGS. 1A-1C. The output pad of driver circuit 400 is coupled to the pull-up transistor and to the pull-down transistor in each of the transistor legs 431-438. Transistor legs 431-438 generate an output signal at the output pad in response to input signal DSA.

Input signal DSA is provided to an input of each of pre-driver circuits 401-402. State machine 450 generates 14 sets of control signals S1-S14. The 14 sets of control signals S1-S14 selectively enable and disable pre-driver circuits 401-414, respectively. Each set of control signals S1-S6 includes 2 or more control signals. Control signals S1-S6 also determine which outputs of pre-driver circuits 401-406, respectively, are enabled to generate output signals.

When pre-driver circuit 401 is enabled by control signals S1, pre-driver circuit 401 buffers signal DSA to generate signal X411, and pre-driver circuit 401 provides signal X411 to the inputs of two of the three pre-driver circuits 403-405 based on control signals S1. When pre-driver circuit 402 is enabled by control signals S2, pre-driver circuit 402 buffers signal DSA to generate signal X412, and pre-driver circuit 402 provides signal X412 to the inputs of two of the three pre-driver circuits 403/405/406 based on control signals S2.

When pre-driver circuit 403 is enabled by control signals S3, pre-driver circuit 403 generates signal X421 by buffering the signal received at its input (signal X411 or X412), and pre-driver circuit 403 provides signal X421 to the inputs of two of the three pre-driver circuits 407-409 based on control signals S3. When pre-driver circuit 404 is enabled by control signals S4, pre-driver circuit 404 buffers the signal at its input (signal X411) to generate signal X422, and pre-driver circuit 404 provides signal X422 to the inputs of two of the three pre-driver circuits 409-411 based on control signals S4. When pre-driver circuit 405 is enabled by control signals S5, pre-driver circuit 405 buffers the signal at its input (X411 or X412) to generate signal X423, and pre-driver circuit 405 provides signal X423 to the inputs of two of the three pre-driver circuits 411-413 based on control signals S5. When pre-driver circuit 406 is enabled by control signals S6, pre-driver circuit 406 buffers the signal at its input (X412) to generate signal X424, and pre-driver circuit 406 provides signal X424 to the inputs of two of the three pre-driver circuits 407/413/414 based on control signals S6.

Pre-driver circuits 407-414 generate signals X431-X438, respectively, at their outputs by buffering the signals received at their respective inputs in response to being enabled by the respective control signals S7-S14. Signals X431-X438 are provided to the inputs of transistor legs 431-438, respectively. Each of signals X431-X438 may be generated based on signal DSA through one of two or more paths through pre-driver circuits 401-414. For example, signal X431 may be generated based on signals DSA, X411, and X421 using pre-driver circuits 401, 403, and 407.

Alternatively, signal X431 may be generated based on signals DSA, X412, and X424 using pre-driver circuits 402, 406, and 407.

The configuration of pre-driver circuits shown in FIG. 4A allows output driver circuit 400 to selectively enable several different combinations of the transistor legs 431-438 to conduct current during different phases of a cycle. An example is now described of how output driver circuit 400 can selectively enable 4 of the transistor legs 431-438 to conduct current to generate the output signal during each of 4 different phases of a repeating cycle. In this example, output driver circuit 400 shifts the transistor legs that are enabled to the right by 2 transistor legs in FIG. 4A in each successive phase of the 4-phase cycle. During the first phase, pre-driver circuits 401, 403-404, and 407-410 enable transistor legs 431-434 to generate the output signal at the output pad based on signal DSA. During the second phase, pre-driver circuits 401, 404-405, and 409-412 enable transistor legs 433-436 to generate the output signal at the output pad based on signal DSA. During the third phase, pre-driver circuits 402, 405-406, and 411-414 enable transistor legs 435-438 to generate the output signal at the output pad based on signal DSA. During the fourth phase, pre-driver circuits 402, 403, 406-408, and 413-414 enable transistor legs 437-438 and 431-432 to generate the output signal at the output pad based on signal DSA. Any of the signal paths that are shown in FIG. 4A through the pre-driver circuits to the enabled transistor legs may be used.

According to another example, output driver circuit 400 shifts the 4 transistor legs that are enabled in each phase to the right in FIG. 4A by 1 transistor leg in each subsequent phase of an 8-phase repeating cycle. During the first phase, pre-driver circuits 401, 403-404, and 407-410 enable transistor legs 431-434 to generate the output signal at the output pad based on signal DSA. During the second phase, pre-driver circuits 401, 403-404, and 408-411 enable transistor legs 432-435 to generate the output signal at the output pad based on signal DSA. During the third phase, pre-driver circuits 401, 404-405, and 409-412 enable transistor legs 433-436 to generate the output signal at the output pad based on signal DSA. During the fourth phase, pre-driver circuits 401, 404-405, and 410-413 enable transistor legs 434-437 to generate the output signal at the output pad based on signal DSA. During the fifth, sixth, seventh, and eighth phases, various subsets of the pre-driver circuits in output driver circuit 400 enable transistor legs 435-438, 431 and 436-438, 431-432 and 437-438, and 431-433 and 438, respectively.

FIG. 4B shows the output driver circuit 400 of FIG. 4A with two additional pre-driver circuits 415-416, according to another embodiment. In the embodiment of FIG. 4B, output driver circuit 400 includes 16 pre-driver circuits 401-416, 8 transistor legs 431-438, and state machine circuit 450. Pre-driver circuits 415-416 receive input signal DSB at their inputs. In an embodiment, output driver circuit 400 generates both of signals DSA and DSB by buffering the same input signal DS.

Pre-driver circuits 401-416 are controlled by state machine 450. Pre-driver circuits 401-416 and state machine 450 are part of the control circuit that controls the operations of output driver circuit 400. In the embodiment of FIG. 4B, state machine 450 generates 16 sets of control signals S1-S16. Pre-driver circuits 415-416 are selectively enabled and disabled in response to control signals S15-S16, respectively.

Pre-driver circuit 415 generates signal X413 by buffering signal DSB when pre-driver circuit 415 is enabled by signals S15. Signal X413 is provided to an input of one of the two pre-driver circuits 403-404 based on control signals S15. Pre-driver circuit 416 generates signal X414 by buffering signal DSB when pre-driver circuit 416 is enabled by signals S16. Signal X414 is provided to an input of one of the two pre-driver circuits 405-406 based on control signals S16.

An example is now described of how output driver circuit 400 of FIG. 4B can selectively enable 2 of the transistor legs 431-438 to conduct current to generate the output signal at the output pad during each of 4 different phases of a repeating cycle. In this example, output driver circuit 400 shifts the transistor legs that are enabled to the right in FIG. 4B by 2 transistor legs in each successive phase of the 4-phase repeating cycle. During the first phase, pre-driver circuits 415, 403, and 407-408 enable transistor legs 431-432 to generate the output signal at the output pad by buffering signal DSB. During the second phase, pre-driver circuits 415, 404, and 409-410 enable transistor legs 433-434 to generate the output signal at the output pad by buffering signal DSB. During the third phase, pre-driver circuits 416, 405, and 411-412 enable transistor legs 435-436 to generate the output signal at the output pad by buffering signal DSB. During the fourth phase, pre-driver circuits 416, 406, and 413-414 enable transistor legs 437-438 to generate the output signal at the output pad by buffering signal DSB.

According to another exemplary implementation of FIG. 4B, output driver circuit 400 shifts the 2 transistor legs that are enabled in each phase to the right in FIG. 4B by 1 transistor leg in each subsequent phase of an 8-phase repeating cycle. In this implementation, output driver circuit 400 enables transistor legs 431-432, 432-433, 433-434, 434-435, 435-436, 436-437, 437-438, and 431/438 to generate the output signal at the output pad by buffering signal DSB during first, second, third, fourth, fifth, sixth, seventh, and eighth phases, respectively, of an 8-phase repeating cycle using the corresponding pre-driver circuits 403-416 and the connections there between shown in FIG. 4B.

FIG. 4C shows the output driver circuit 400 of FIG. 4B with 6 additional pre-driver circuits 417-422, according to an embodiment. In the embodiment of FIG. 4C, output driver circuit 400 includes 22 pre-driver circuits 401-422, 8 transistor legs 431-438, and state machine circuit 450. Pre-driver circuits 417-418 receive input signal DSC at their inputs. Output driver circuit 400 may generate input signals DSA, DSB, and DSC by buffering the same input signal DS (e.g., using buffer circuits), or signals DSA, DSB, and DSC may be the same input signal.

In the embodiment of FIG. 4C, state machine 450 generates 22 sets of control signals S1-S22 that control pre-driver circuits 401-422, respectively. Pre-driver circuits 417-422 are selectively enabled and disabled in response to control signals S17-S22, respectively. Pre-driver circuits 401-422 and state machine 450 are part of the control circuit that controls output driver circuit 400.

When pre-driver circuit 417 is enabled by signals S17, pre-driver circuit 417 buffers signal DSC to generate signal X415, which is provided to an input of one of the two pre-driver circuits 419-420 as determined by signals S17. When pre-driver circuit 418 is enabled by signals S18, pre-driver circuit 418 buffers signal DSC to generate signal X416, which is provided to an input of one of the two pre-driver circuits 421-422 as determined by signals S18. When a corresponding pre-driver circuit 419-422 is enabled by the respective set of signals S19-S22, that pre-driver circuit 419-422 buffers the signal at its input (X415 or X416) to generate the respective one of signals X425-X428. Signals S19-S22 determine which one of the two pre-driver circuits in each of the respective pairs of pre-driver circuits 407-408, 409-410, 411-412, and 413-414 receives the respective signal X425-X428. For example, signals S19 may cause pre-driver circuit 419 to provide signal X425 to either pre-driver circuit 407 or to pre-driver circuit 408. Each of the pre-driver circuits 407-414 buffers the signal at its input to generate the respective signal X431-X438 at its output. Output driver circuit 400 is implemented so that each of pre-driver circuits 407-414 receives only one input signal at a time. Control signals S17-S22 may disable one or more of the respective pre-driver circuits 417-422.

An example is now described of how output driver circuit 400 of FIG. 4C can selectively enable 1 of the transistor legs 431-438 to conduct current to generate the output signal at the output pad during each of 8 different phases of a repeating cycle. In this example, output driver circuit 400 shifts the one transistor leg that is enabled to the right in FIG. 4C by 1 transistor leg in each successive phase of the 8-phase repeating cycle. During the first phase, pre-driver circuits 417, 419, and 407 enable transistor leg 431 to generate the output signal at the output pad by buffering signal DSC. During the second phase, pre-driver circuits 417, 419, and 408 enable transistor leg 432 to generate the output signal at the output pad by buffering signal DSC. Pre-driver circuits 417, 420, and 409-410 enable transistor legs 433 and 434 to generate the output signal at the output pad by buffering signal DSC during the third and fourth phases, respectively, of the cycle. Pre-driver circuits 418, 421-422, and 411-414 enable transistor legs 435-438 to generate the output signal at the output pad by buffering signal DSC during the fifth, sixth, seventh, and eighth phases, respectively, of the cycle.

Figure 5:
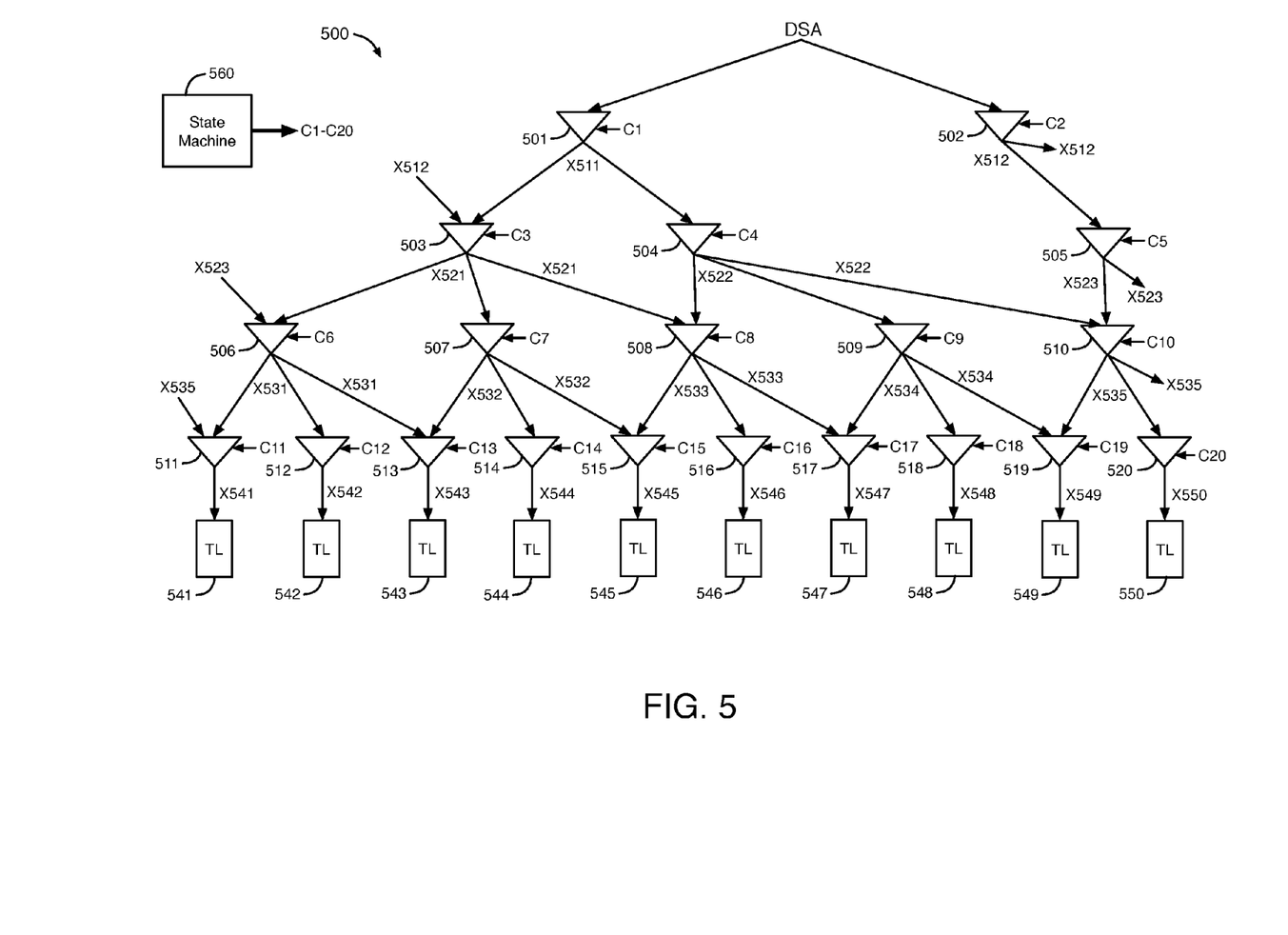
FIG. 5 illustrates a portion of an output driver circuit that includes four stages of pre-driver circuits and ten transistor legs, according to another embodiment.

FIG. 5 illustrates a portion of an output driver circuit 500 that includes 4 stages of pre-driver circuits and 10 transistor legs, according to another embodiment. As shown in FIG. 5, output driver circuit 500 includes 20 pre-driver circuits 501-520, 10 transistor legs 541-550, and a state machine circuit 560. Pre-driver circuits 501-520 are controlled by state machine 560. Each of the transistor legs 541-550 includes at least one pull-up transistor and at least one pull-down transistor that are coupled as disclosed herein with respect to FIGS. 1A-1C to generate an output signal at an output pad.

State machine 560 generates 20 sets of control signals C1-C20. The 20 sets of control signals C1-C20 selectively enable pre-driver circuits 501-520 to generate signals X511-X512, X521-X523, X531-X535, and X541-X550, respectively. Input signal DSA is provided to an input of each of pre-driver circuits 501-502. Each of the 10 sets of control signals C1-C10 includes 2 or more control signals. Control signals C1-C10 also determine which of the outputs of pre-driver circuits 501-510 are enabled to generate output signals X511-X512, X521-X523, X531-X535, respectively.

The configuration of pre-driver circuits shown in FIG. 5 allows output driver circuit 500 to selectively enable several different combinations of the transistor legs 541-550 to conduct current during different phases of a repeating cycle. According to various exemplary implementations, output driver circuit 500 may enable 1, 2, 3, 4, or more transistor legs in each phase of a repeating cycle. Output driver circuit 500 may shift the transistor legs that are enabled to the right in FIG. 5 by any suitable number in each subsequent phase of the cycle.

An example is now described of how output driver circuit 500 can selectively enable 4 of the transistor legs 541-550 to conduct current to generate the output signal during each of 5 different phases of a repeating cycle. In this example, output driver circuit 500 shifts the transistor legs that are enabled to the right in FIG. 5 by 2 transistor legs in each subsequent phase of the 5-phase cycle.

During the first phase, pre-driver circuits 501, 503, 506-507, and 511-514 enable transistor legs 541-544 to generate the output signal at the output pad by buffering signal DSA. During the second phase, pre-driver circuits 501, 503, 507-508, and 513-516 enable transistor legs 543-546 to generate the output signal at the output pad by buffering signal DSA. During the third phase, pre-driver circuits 501, 504, 508-509, and 515-518 enable transistor legs 545-548 to generate the output signal at the output pad by buffering signal DSA. During the fourth phase, pre-driver circuits 501, 504, 509-510, and 517-520 enable transistor legs 547-550 to generate the output signal at the output pad by buffering signal DSA. During the fifth phase, pre-driver circuits 502, 505-506, 510-512, and 519-520 enable transistor legs 541-542 and 549-550 to generate the output signal at the output pad by buffering signal DSA.

The methods and apparatuses disclosed herein may be incorporated into any suitable electronic device or system of electronic devices. For example, the methods and apparatuses may be incorporated into numerous types of integrated circuits, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The integrated circuits disclosed herein may be part of a data processing system that includes one or more of the following components; a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or in a different order, or described operations may be distributed in a system that allows the occurrence of the processing operations at various intervals associated with the processing.

The foregoing description of the exemplary embodiments of the present invention is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An output driver circuit comprising:
   first and second transistor legs coupled to an output pad, wherein the first transistor leg comprises a first pull-up transistor and a first pull-down transistor, and wherein the second transistor leg comprises a second pull-up transistor and a second pull-down transistor;
   a control circuit coupled to the first and second transistor legs; and
   third and fourth transistor legs coupled to the output pad, wherein the third transistor leg comprises a third pull-up transistor and a third pull-down transistor, wherein the fourth transistor leg comprises a fourth pull-up transistor and a fourth pull-down transistor, wherein the control circuit is coupled to the third and fourth transistor legs, wherein the control circuit enables the first and third transistor legs to generate an output signal at the output pad and disables the second and fourth transistor legs during a first phase of a cycle, wherein the first pull-up transistor turns on and off during the first phase, wherein the first pull-down transistor turns on and off during the first phase, wherein the control circuit enables the second and fourth transistor legs to generate the output signal at the output pad and disables the first and third transistor legs during a second phase of the cycle, wherein the second pull-up transistor turns on and off during the second phase, wherein the second pull-down transistor turns on and off during the second phase, and wherein the control circuit repeats the first and second phases of the cycle.

2. The output driver circuit of claim 1, wherein the output driver circuit is configurable to enable the first and second transistor legs to generate the output signal at the output pad concurrently during another cycle.

3. An output driver circuit comprising:
first and second transistor legs coupled to an output pad, wherein the first transistor leg comprises a first pull-up transistor and a first pull-down transistor, and wherein the second transistor leg comprises a second pull-up transistor and a second pull-down transistor;
a control circuit coupled to the first and second transistor legs, wherein the control circuit enables the first transistor leg to generate an output signal at the output pad and disables the second transistor leg during a first phase of a cycle; and
third and fourth transistor legs coupled to the output pad, wherein the third transistor leg comprises a third pull-up transistor and a third pull-down transistor, wherein the fourth transistor leg comprises a fourth pull-up transistor and a fourth pull-down transistor,
wherein the control circuit is coupled to the third and fourth transistor legs, wherein the control circuit enables the second and third transistor legs to generate the output signal at the output pad and disables the first and fourth transistor legs during a second phase of the cycle, wherein the control circuit enables the fourth transistor leg to generate the output signal at the output pad and disables the first, second, and third transistor legs during a third phase of the cycle, and wherein the control circuit repeats the first, second and third phases of the cycle at least twice.

4. The output driver circuit of claim 3 further comprising:
fifth and sixth transistor legs coupled to the output pad, wherein the fifth transistor leg comprises a fifth pull-up transistor and a fifth pull-down transistor, wherein the sixth transistor leg comprises a sixth pull-up transistor and a sixth pull-down transistor,
wherein the control circuit is coupled to the fifth and sixth transistor legs, wherein the control circuit enables the first and fifth transistor legs to generate the output signal at the output pad and disables the third, fourth, and sixth transistor legs during the first phase, and wherein the control circuit enables the fourth and sixth transistor legs to generate the output signal at the output pad and disables the fifth transistor leg during the third phase of the cycle.

5. An output driver circuit comprising:
first and second transistor legs coupled to an output pad, wherein the first transistor leg comprises a first pull-up transistor and a first pull-down transistor, and wherein the second transistor leg comprises a second pull-up transistor and a second pull-down transistor;
a control circuit coupled to the first and second transistor legs, wherein the first pull-up transistor turns on and off during a first phase of a cycle, wherein the first pull-down transistor turns on and off during the first phase, wherein the second pull-up transistor turns on and off during a second phase of the cycle, wherein the second pull-down transistor turns on and off during the second phase; and
third and fourth transistor legs coupled to the output pad, wherein the third transistor leg comprises a third pull-up transistor and a third pull-down transistor, wherein the fourth transistor leg comprises a fourth pull-up transistor and a fourth pull-down transistor,
wherein the control circuit comprises a state machine circuit and pre-driver circuits, wherein the state machine circuit generates control signals that control the pre-driver circuits, and wherein the pre-driver circuits are selectively enabled in response to the control signals to generate first and second buffered signals based on an input signal,
wherein a first set of the pre-driver circuits that are enabled during the first phase provide the first buffered signal to the first transistor leg, wherein a second set of the pre-driver circuits that are enabled during the second phase provide the second buffered signal to the second transistor leg, wherein the first transistor leg generates an output signal based on the first buffered signal, wherein the second transistor leg generates the output signal based on the second buffered signal,
wherein the control circuit is coupled to the third and fourth transistor legs, wherein the control circuit enables the first and third transistor legs to generate the output signal at the output pad and disables the second and fourth transistor legs during the first phase, wherein the control circuit enables the second and third transistor legs to generate the output signal at the output pad and disables the first and fourth transistor legs during the second phase, wherein the control circuit enables the second and fourth transistor legs to generate the output signal at the output pad and disables the first and third transistor legs during a third phase of the cycle, and wherein the control circuit repeats the first, second and third phases of the cycle periodically.

6. An output driver circuit comprising:
first, second, third, and fourth transistor legs, wherein the first transistor leg comprises a first pull-up transistor and a first pull-down transistor, wherein the second transistor leg comprises a second pull-up transistor and a second pull-down transistor, wherein the third transistor leg comprises a third pull-up transistor and a third pull-down transistor, and wherein the fourth transistor leg comprises a fourth pull-up transistor and a fourth pull-down transistor; and
a control circuit coupled to the first, second, third, and fourth transistor legs, wherein the control circuit enables the first and second transistor legs to generate an output signal at an output pad and disables the third and fourth transistor legs during a first phase of a first repeating cycle, wherein the control circuit enables the third and fourth transistor legs to generate the output signal at the output pad and disables the first and second transistor legs during a second phase of the first repeating cycle, and wherein the control circuit enables the second and third transistor legs to generate the output signal and disables the first and fourth transistor legs during a third phase of the first repeating cycle.

7. The output driver circuit of claim 6, wherein the first pull-up transistor turns on and off during the first phase, wherein the first pull-down transistor turns on and off during the first phase, wherein the third pull-up transistor turns on and off during the second phase, and wherein the third pull-down transistor turns on and off during the second phase.

8. The output driver circuit of claim 6, further comprising:
fifth and sixth transistor legs, wherein the fifth transistor leg comprises a fifth pull-up transistor and a fifth pull-down transistor, wherein the sixth transistor leg comprises a sixth pull-up transistor and a sixth pull-down transistor, wherein the control circuit enables the first, second, third, and fourth transistor legs to generate the output signal and disables the fifth and sixth transistor legs during a first phase of a second repeating cycle, and wherein the control circuit enables the third, fourth, fifth, and sixth transistor legs to generate the output signal and disables the first and second transistor legs during a second phase of the second repeating cycle.

9. The output driver circuit of claim 6, wherein the output driver circuit enables and disables the transistors in the first, second, third, and fourth transistor legs based on advance information about bits that the output driver circuit has not yet received in an input signal that the output driver circuit buffers to generate the output signal.

10. An output driver circuit comprising:
first, second, third, and fourth transistor legs, wherein the first transistor leg comprises a first pull-up transistor and a first pull-down transistor, wherein the second transistor leg comprises a second pull-up transistor and a second pull-down transistor, wherein the third transistor leg comprises a third pull-up transistor and a third pull-down transistor, and wherein the fourth transistor leg comprises a fourth pull-up transistor and a fourth pull-down transistor; and a control circuit coupled to the first, second, third, and fourth transistor legs, wherein the control circuit enables the first and second transistor legs to generate an output signal at an output pad and disables the third and fourth transistor legs during a first phase of a first repeating cycle, wherein the control circuit enables the third and fourth transistor legs to generate the output signal at the output pad and disables the first and second transistor legs during a second phase of the first repeating cycle, wherein the control circuit enables the first, second, and third transistor legs to generate the output signal and disables the fourth transistor leg during a first phase of a second repeating cycle, and wherein the control circuit enables the second, third, and fourth transistor legs to generate the output signal and disables the first transistor leg during a second phase of the second repeating cycle.

11. An output driver circuit comprising:
first, second, third, and fourth transistor legs, wherein the first transistor leg comprises a first pull-up transistor and a first pull-down transistor, wherein the second transistor leg comprises a second pull-up transistor and a second pull-down transistor, wherein the third transistor leg comprises a third pull-up transistor and a third pull-down transistor, and wherein the fourth transistor leg comprises a fourth pull-up transistor and a fourth pull-down transistor;

a control circuit coupled to the first, second, third, and fourth transistor legs, wherein the control circuit enables the first and second transistor legs to generate an output signal at an output pad and disables the third and fourth transistor legs during a first phase of a repeating cycle, and wherein the control circuit enables the third and fourth transistor legs to generate the output signal at the output pad and disables the first and second transistor legs during a second phase of the repeating cycle; and fifth and sixth transistor legs, wherein the fifth transistor leg comprises a fifth pull-up transistor and a fifth pull-down transistor, wherein the sixth transistor leg comprises a sixth pull-up transistor and a sixth pull-down transistor, wherein the control circuit enables the fifth and sixth transistor legs to generate the output signal at the output pad and disables the first, second, third, and fourth transistor legs during a third phase of the repeating cycle, and wherein the control circuit disables the fifth and sixth transistor legs during the first and second phases of the repeating cycle.

12. A method comprising:
enabling a first transistor leg in an output driver circuit to generate an output signal at an output pad during a first phase of a first repeating cycle using a control circuit;

disabling a second transistor leg in the output driver circuit from generating the output signal during the first phase of the first repeating cycle using the control circuit, wherein the first transistor leg comprises a first pull-up transistor and a first pull-down transistor, and wherein the second transistor leg comprises a second pull-up transistor and a second pull-down transistor;

enabling the second transistor leg and a third transistor leg in the output driver circuit to generate the output signal at the output pad during a second phase of the first repeating cycle using the control circuit, wherein the third transistor leg comprises a third pull-up transistor and a third pull-down transistor;

disabling the first transistor leg and fourth and fifth transistor legs in the output driver circuit from generating the output signal during the second phase of the first repeating cycle using the control circuit, wherein the fourth transistor leg comprises a fourth pull-up transistor and a fourth pull-down transistor, and wherein the fifth transistor leg comprises a fifth pull-up transistor and a fifth pull-down transistor;

enabling the fourth and fifth transistor legs to generate the output signal at the output pad during a third phase of the first repeating cycle using the control circuit; and disabling the first, second, and third transistor legs from generating the output signal during the third phase using the control circuit.

13. The method of claim 12 further comprising:
disabling the third, fourth, and fifth transistor legs in the output driver circuit from generating the output signal during the first phase using the control circuit.

14. The method of claim 12 further comprising:
turning the first pull-up transistor on and off during the first phase;

turning the first pull-down transistor on and off during the first phase;

turning the second pull-up transistor on and off during the second phase; and turning the second pull-down transistor on and off during the second phase.

15. The method of claim 12 further comprising:

enabling the first and second transistor legs and the third transistor leg in the output driver circuit to generate the output signal at the output pad during a first phase of a second repeating cycle using the control circuit;

disabling the fourth transistor leg in the output driver circuit from generating the output signal during the first phase of the second repeating cycle using the control circuit;

enabling the second, third, and fourth transistor legs to generate the output signal at the output pad during a second phase of the second repeating cycle using the control circuit; and disabling the first transistor leg from generating the output signal during the second phase of the second repeating cycle using the control circuit.

16. The method of claim 12 further comprising:

enabling the third and fourth transistor legs in the output driver circuit to generate the output signal at the output pad during a first phase of a second repeating cycle using the control circuit;

disabling the fifth transistor leg and a sixth transistor leg in the output driver circuit from generating the output signal during the first phase of the second repeating cycle using the control circuit, wherein the sixth transistor leg comprises a sixth pull-up transistor and a sixth pull-down transistor;

disabling the third and fourth transistor legs from generating the output signal during a second phase of the second repeating cycle using the control circuit; and enabling the fifth and sixth transistor legs to generate the output signal at the output pad during the second phase of the second repeating cycle using the control circuit.

17. The method of claim 12 further comprising:

providing a first buffered signal to the first transistor leg using a first set of pre-driver circuits that are enabled during the first phase of the first repeating cycle;

generating the output signal based on the first buffered signal during the first phase using the first transistor leg;

providing a second buffered signal to the second transistor leg using a second set of pre-driver circuits that are enabled during the second phase of the first repeating cycle; and generating the output signal based on the second buffered signal during the second phase using the second transistor leg.

* * * * *